United States Patent [19]
Doyle

[11] Patent Number: 5,856,980
[45] Date of Patent: Jan. 5, 1999

[54] BASEBAND ENCODING METHOD AND APPARATUS FOR INCREASING THE TRANSMISSION RATE OVER A COMMUNICATION MEDIUM

[75] Inventor: James T. Doyle, Chandler, Ariz.

[73] Assignee: Intel Corporation, Santa Clara, Calif.

[21] Appl. No.: 351,695

[22] Filed: Dec. 8, 1994

[51] Int. Cl.[6] ...................................................... G06F 11/00
[52] U.S. Cl. ........................ 371/5.1; 371/49.1; 375/363; 375/264; 375/377; 375/286
[58] Field of Search .................... 371/5.1, 49.1, 371/37.1, 43, 5.2; 370/9, 114, 13, 34, 102; 375/3.1, 4, 10, 17, 24, 121, 224, 225, 377, 264, 363, 295

[56] References Cited

U.S. PATENT DOCUMENTS

| | | | |
|---|---|---|---|
| 3,652,802 | 3/1972 | Schellenberg | 179/15 BS |
| 4,742,544 | 5/1988 | Kupnicki et al. | 380/14 |
| 5,081,619 | 1/1992 | Nagata | 370/13 |
| 5,233,629 | 8/1993 | Paik et al. | 375/39 |
| 5,408,499 | 4/1995 | Sasaki | 375/286 |
| 5,408,500 | 4/1995 | Ginzburg et al. | 375/288 |
| 5,438,571 | 8/1995 | Albrecht et al. | 370/94.3 |

Primary Examiner—Phung Chung
Attorney, Agent, or Firm—Blakely, Sokoloff, Taylor & Zafman

[57] ABSTRACT

An encoder for encoding binary data bits supplied by a data source into pulse amplitude modulated multilevel symbols. The encoder includes a bit stuffer for receiving the data bits from the data source at a first data bit rate, which at most equals a maximum data bit rate. The bit stuffer then adds descriptive bits to the data bits at a descriptive bit rate, which at most equals a maximum descriptive bit rate. The encoder also includes a multilevel pulse amplitude modulator for receiving the data and descriptive bits from the bit stuffer and for converting the data and descriptive bits into pulse amplitude modulated multilevel symbols. When these multilevel PAM symbols are transmitted, they have a spectral energy characteristic which is below a predetermined low level threshold at a predetermined baseband bandwidth frequency. In addition, these multilevel PAM symbols have a symbol rate (i.e., baud rate) which at most equals a maximum baud rate when the first data bit rate equals the maximum data bit rate and the descriptive bit rate equals the maximum descriptive bit rate. In turn, the magnitude of the maximum baud rate equals the magnitude of the baseband bandwidth frequency.

32 Claims, 8 Drawing Sheets

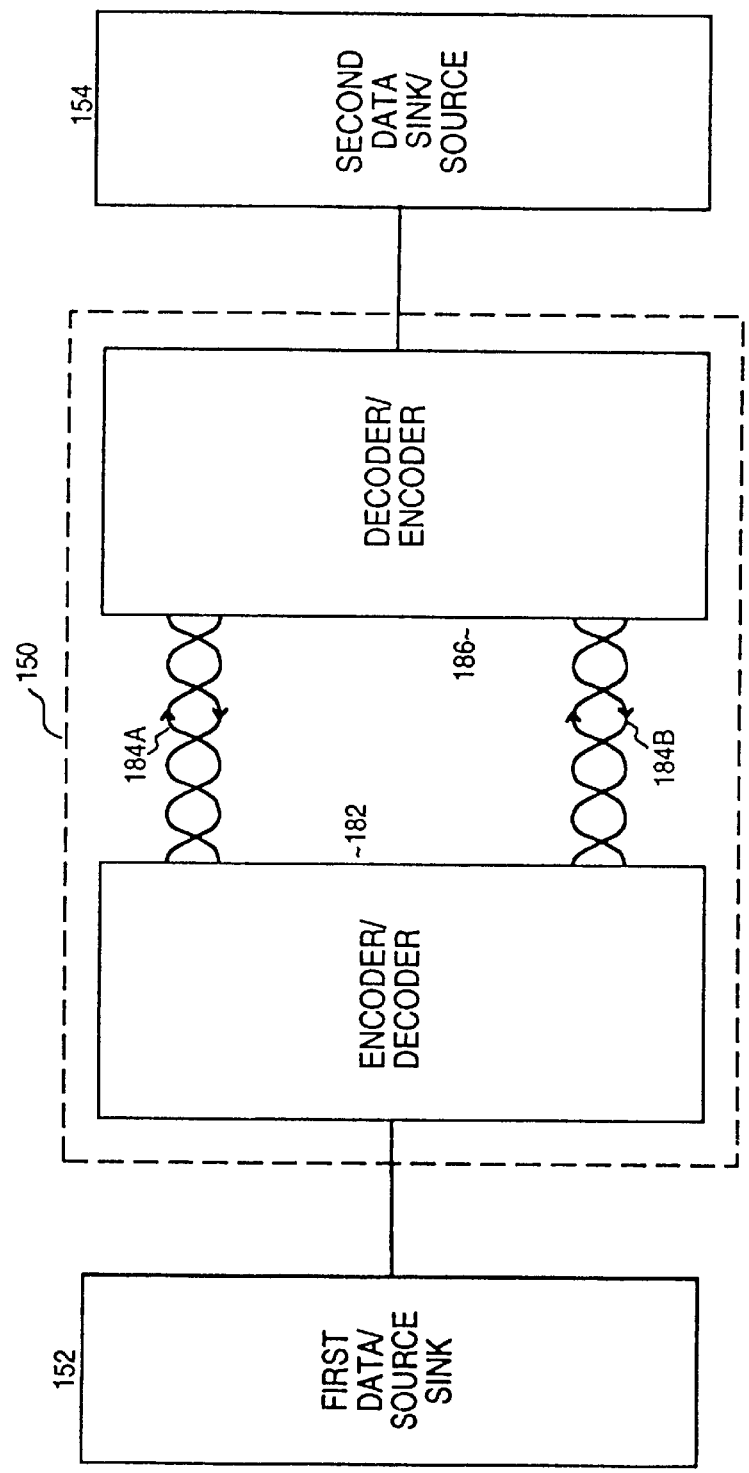
F I G. 5

BASEBAND ENCODING METHOD AND APPARATUS FOR INCREASING THE TRANSMISSION RATE OVER A COMMUNICATION MEDIUM

BACKGROUND OF THE INVENTION

1. Field of the Invention

The present invention relates to the field of communication, and particularly to a baseband encoding/decoding method and apparatus for increasing the transmission rate over a communication medium while maintaining the desired bandwidth, bit error rate, and hamming distance.

2. Art Background

For several reasons, in the past few years there has been an increase in demand for data communication systems that can operate at high bit rates (such as 100 MBits/s). One reason for this increase has been the proliferation of data communication networks that can perform multi-media tasks, which require the communication of a large amount of data in a short amount of time. The increasing instruction execution speed of microprocessors also has resulted in the increased demand for data communication systems that can operate at high bit rates. Therefore, currently high bit rate data communication systems are being developed.

Implementations of these high speed data communication systems often confront numerous obstacles. For example, since the bit error rate (BER) increases proportionately with the bit rate and since the hamming distance decreases with the increasing BER, the maintenance of the desired BER and hamming distance are two constraints placed on the implementations of high speed data communication systems. Furthermore, solutions for maintaining the desired BER and hamming distance often have to comply with strict regulatory and design limitations placed on the bandwidth of the communicated data.

An example of one recently developed prior art data communication system, that maintains the desired BER, hamming distance, and bandwidth, while increasing the bit rate, is the 100BaseT4T+ Ethernet data communication system. This prior art system is designed to replace the 10 MBit Ethernet (10 BaseT) data communication systems, which utilizes a Manchester baseband coding method to send 10 MBits/s of data over two twisted pairs in a full-duplex mode (i.e., one twisted pair is used to receive data while the second twisted pair is used to transmit data). Like the 10 MBit Ethernet network, the 100BaseT4T+ Ethernet system is a baseband system, which renders it compatible with 10 MBit Ethernet networks.

On the other hand, unlike the 10 MBit Ethernet system, the 100BaseT4T+ Ethernet system uses four twisted pairs, three of which transmit data in a half-duplex mode (i.e., the three twisted pairs either all transmit or receive at any one time), while the fourth transmits control signals. In addition, because of the Federal Communication Commission's (FCC's) Part 15B requirement, which requires transmitted data signals to be 76 dBs below 0 dBm at 30 MHz, this 100 MBit Ethernet implementation does not use the Manchester pulse code modulation (PCM) scheme. If this 100 MBit Ethernet network used a Manchester PCM, a bandwidth of 50 MHz would be required, which in turn would violate the 30 MHz bandwidth restriction of the FCC. Consequently, in order to reduce the transmission bandwidth of this system below the 30 MHz FCC bandwidth requirement (i.e., reduce baud rate of this system to 25 MBaud), this 100 MBit Ethernet implementation uses an 8B-6T code (i.e., a code which represents eight binary bits-by six symbol pulses that can have any one of three values). In addition, the 8B-6T code enables the 100BaseT4T+ Ethernet system to increase the bit rate (from 10 MBits to 100 MBits) while maintaining the maximum BER and minimum hamming distance requirements set forth by IEEE 802.3 standard for 10 MBit Ethernet systems. More specifically, for 100 meters of unshielded twisted pair cable, the 100BaseT4T+ Ethernet maintains its BER at or below $10^{-9}$ and its hamming distance at or above 4, because it uses code redundancy techniques as it only needs 256 of the available 729 codes of the 8B-6T code.

Unfortunately, this prior art 100 MBit Ethernet network cannot readily be implemented in the United States because, in order to utilize the available present day Ethernet network infrastructure in the U.S., additional wiring has to be done. For example, the majority of the present day Ethernet networks use four twisted pairs to couple each data node (i.e., each data source, hub, and repeater). However, because hubs and repeaters need to receive bi-directional transmissions, four additional twisted pairs need to be placed between each hub and repeater and between each pair of repeaters, in order to implement the 100BasetT4T+ Ethernet system.

In addition, this prior art implementation cannot be easily adopted in the international arena because most Ethernet networks in foreign countries use only two twisted pairs to couple their communication nodes. Furthermore, because this prior art implementation uses four twisted pairs, it requires more electronic circuitry than an Ethernet network that uses two twisted pairs. In turn, the additional electronic circuitry makes this prior art 100 MBit Ethernet implementation more expensive than an implementation that uses less than four twisted pairs. Finally, by operating at only 25 MBaud, this 100 MBit Ethernet implementation does not optimally utilize the 30 MHz bandwidth that the FCC allows.

SUMMARY OF THE INVENTION

The present invention provides a baseband encoding/decoding method and apparatus for increasing the transmission bit rate over a communication medium, while maintaining the desired bandwidth, bit error rate (BER), and hamming distance. More specifically, the present invention is an encoder for encoding binary data bits supplied by a data source into pulse amplitude modulated multilevel symbols. The encoder includes a bit stuffer for receiving the data bits from the data source at a first data bit rate, which at most equals a maximum data bit rate. The bit stuffer then adds descriptive bits to the data bits at a descriptive bit rate, which at most equals a maximum descriptive bit rate.

The encoder also includes a multilevel pulse amplitude modulator for receiving the data and descriptive bits from the bit stuffer and for converting the data and descriptive bits into pulse amplitude modulated multilevel symbols. When these multilevel PAM symbols are transmitted, they have a spectral energy characteristic which is below a predetermined low level threshold at a predetermined baseband bandwidth frequency. In addition, these multilevel PAM symbols have a symbol rate (i.e., baud rate) which at most equals a maximum baud rate when the first data bit rate equals the maximum data bit rate and the descriptive bit rate equals the maximum descriptive bit rate. In turn, the magnitude of the maximum baud rate equals the magnitude of the baseband bandwidth frequency.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 5 is yet another embodiment of the encoding/decoding apparatus of the present invention, which is a 100 MBit two twisted pair half-duplex Ethernet network.

DETAILED DESCRIPTION OF THE INVENTION

In the following description for purposes of explanation numerous details are set forth in order to provide a thorough understanding of the present invention. However, it will be understood by one skilled in the art that these specific details are not required in order to practice the invention. In other instances, well-known electrical structures and circuits (such as bit stuffers, modulators, filters, quantizers, automatic gain controllers, equalizers, demodulators, bit strippers, clock recovery circuits, etc.) are shown in block diagram form in order not to obscure the present invention with unnecessary detail.

Figure 1:
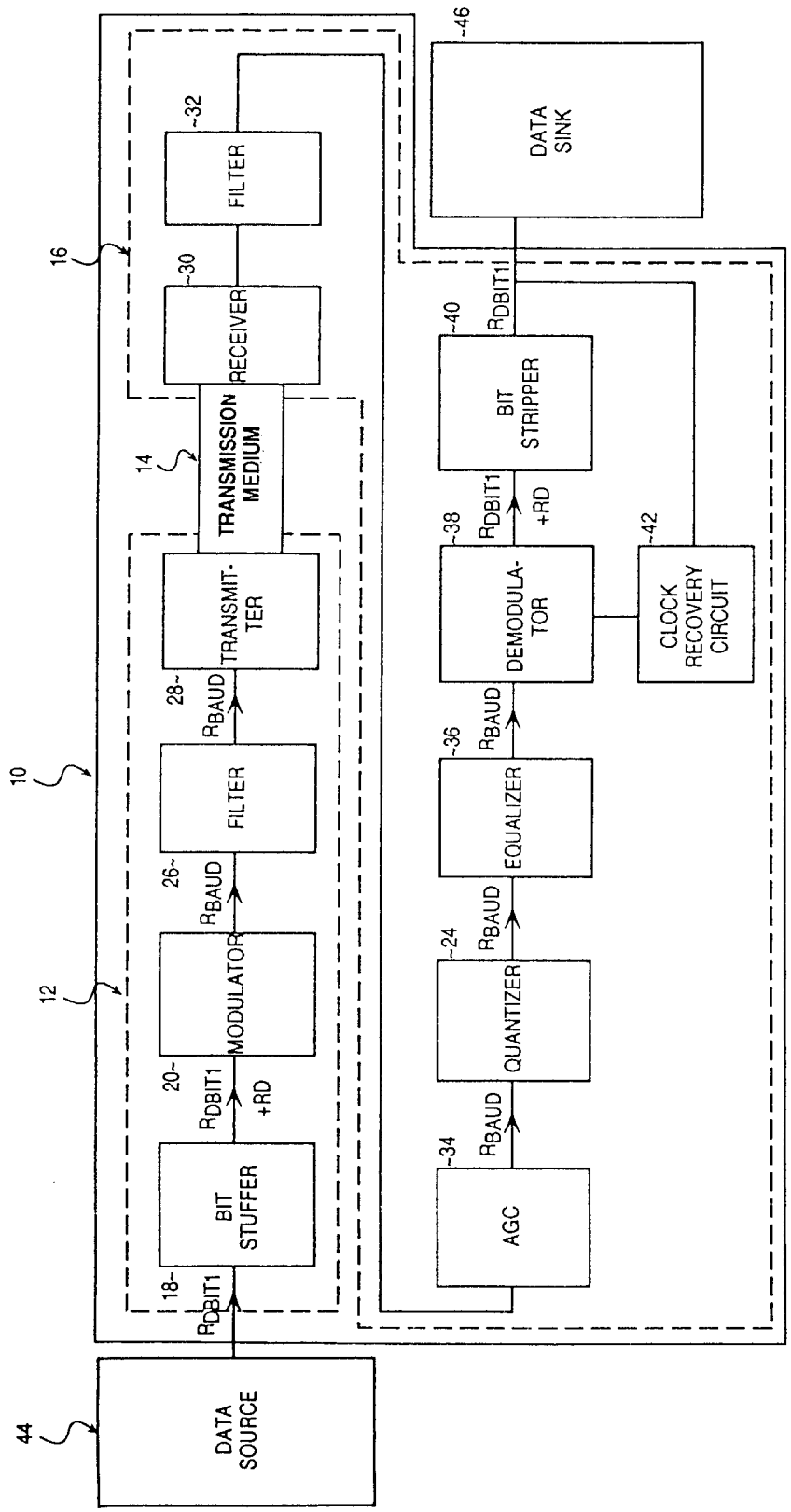
FIG. 1 presents one embodiment of the encoder/decoder apparatus of the present invention.

The present invention provides a baseband encoding/decoding method and apparatus for increasing the transmission bit rate over a communication medium, while maintaining the desired bandwidth, bit error rate (BER), and hamming distance. FIG. 1 presents one embodiment of the encoder/decoder apparatus of the present invention. As shown in this figure, encoder/decoder apparatus 10 includes encoder 12, transmission medium 14, and decoder 16. Encoder 12 transmits to decoder 16 multilevel pulse amplitude modulated symbols at a predetermined baud rate ($R_{BAUD}$).

An important aspect of encoder/decoder apparatus 10 is that it realizes that there is an energy null at a frequency whose magnitude equals the magnitude of the baud rate, when a multilevel pulse amplitude modulation (PAM) scheme is used. Multilevel PAM scheme is a baseband coding technique which uses the pulse level of a symbol to represent data bits (i.e., the data is encoded in a symbol's pulse level).

Some examples of multilevel pulse amplitude modulation schemes are: (1) 2B-1Q coding scheme, which represents two binary bits with one pulse symbol that can have any one of four values; (2) 3B-1O coding scheme, which represents three binary bits with one pulse symbol that can have any one of eight values; (3) 3B-2T coding scheme, which represents three binary bits with two pulse symbol that can have any one of three values; and (4) 4B-1H coding scheme, which represents four binary bits with one pulse symbol that can have any one of sixteen values. As mentioned below, for one embodiment of encoder/decoder apparatus 10, encoder 12 uses a multilevel pulse amplitdue modulation scheme with more than two levels, in order to reduce the necessary transmission bandwidth. In addition, when multilevel PAM scheme with more than two levels is used, the magnitude of the frequency of the shortest cycle is one half of the magnitude of the baud rate because at least two levels (i.e., two symbols) are necessary to have a cycle. Consequently, since the sinc ((sinx)/x) response of the pulse amplitude modulated symbols has a first null at twice the frequency of the shortest cycle, there is an energy null at the frequency whose magnitude equals the magnitude of the baud rate.

Encoder/decoder apparatus 10 then uses this realization to set the magnitude of the maximum baud rate ($R_{BAUDMAX}$) equal to the magnitude of the baseband bandwidth frequency ($f_{BW}$) when data source 44 supplies data to encoder 12 at a maximum bit rate of ($R_{DBITMAX}$) and bit stuffer 18 adds parity bits to the data stream at the maximum descriptive bit rate ($R_{dMAX}$). As mentioned below, encoder/decoder apparatus 10 sets the magnitude of the maximum baud rate ($R_{BAUDMAX}$) equal to the magnitude of the baseband bandwidth frequency ($f_{BW}$) in order to use the surplus spectral energy in the bandwidth to add descriptive bits, which in turn minimizes the BER and maximizes the hamming distance. It should be noted that the baseband bandwidth frequency ($f_{BW}$) is the frequency at which the spectral energy characteristics of the transmitted data should be at a null or below some predetermined low level threshold. This baseband bandwidth frequency is often imposed by either design constraints (such as backward compatibility with prior systems) or regulatory constraints (such as FCC's Part 15B requirement).

As further shown in FIG. 1, bit stuffer 18 of encoder 12 receives data bits from data source 44 at a first data bit rate ($R_{DBIT1}$), which (as mentioned before) at most equals the maximum data bit rate ($R_{DBITMAX}$). Due to design limitations, often the maximum data bit rate ($R_{DBITMAX}$) is less than a maximum bit rate ($R_{BITMAX}$) that encoder 12 can transmit to decoder 16. The maximum data bit rate ($R_{DBITMAX}$) and the maximum bit rate ($R_{BITMAX}$) are related respectively to a maximum data baud rate ($R_{DBAUDMAX}$) and the maximum baud rate ($R_{BAUDMAX}$) by a simple relationship based on the specific coding scheme used by modulator 20. For example, as described below, if modulator 20 uses a 2B-1Q coding scheme, the maximum data bit rate and the maximum bit rate respectively will be twice the maximum data baud rate and the maximum baud rate (e.g., $R_{DBITMAX}=2*R_{DBAUDMAX}$, and $R_{BITMAX}=2*R_{BAUDMAX}$).

Bit stuffer 18 then adds descriptive bits at a descriptive bit rate ($R_d$) to the stream of data bits. The added descriptive bits can be start/stop delimiter bits, which are added in the embodiments of the present invention that utilize coding schemes that require start and stop bits. The descriptive bits also can include bits that are added pursuant to error correction or detection schemes, which can be utilized for improving the BER and hamming distance. For example, the descriptive bits can be parity bits that are added in order to maintain the BER and hamming distance associated with a second lower data bit rate ($R_{DBIT2}$), while increasing the data rate from the second data bit rate ($R_{DBIT2}$) to the first data bit rate ($R_{DBIT1}$, which has a maximum value of $R_{DBITMAX}$). In other words, for one embodiment of the present invention, bit stuffer 18 adds parity bits to the data bit stream so that an increase in the data bit rate (e.g., an increase from $R_{DBIT2}$ to $R_{DBIT1}$) does not increase the BER beyond a desired maximum BER. In turn, by maintaining the BER at or below the desired value, the addition of the parity bits also helps maintain the required hamming distance.

The descriptive bit rate ($R_d$) at most equals the maximum bit rate minus the maximum data bit rate (i.e., $R_{dMAX}=$ $R_{BITMAX}$–$R_{DBITMAX}$). Clearly, the descriptive bit rate does not always need to equal its maximum value ($R_{dMAX}$). However, encoder/decoder apparatus 30 is optimally utilized by embodiments that add descriptive bits at the maximum descriptive bit rate ($R_{dMAX}$), because such embodiments use the entire surplus spectral energy in the bandwidth (i.e., the spectral energy from a frequency whose magnitude equals the magnitude of $R_{DBAUDMAX}$ to $f_{BW}$, which corresponds to the spectral energy in the bit bandwidth from a frequency whose magnitude equals the magnitude of $R_{DBIT-MAX}$ to a frequency whose magnitude equals the magnitude of $R_{BITMAX}$) to add descriptive bits. In turn, maximizing the number of descriptive bits minimizes the BER and maximizes the hamming distance.

Bit stuffer 18 then supplies the information stream to modulator 20 at a bit transmission rate equal to the data bit rate plus the descriptive bit rate (i.e., $R_{DBIT1}+R_d$). The modulator in turn encodes the bit stream into a plurality of PAM symbols having a symbol transmission rate ($R_{BAUD}$). In one embodiment of the encoder/decoder apparatus 10, modulator 20 uses a multilevel baseband code with three or more levels to represent a plurality of bits as one symbol, so that an increase in the data rate from a lower second data bit rate ($R_{DBIT2}$) to a higher first data bit rate ($R_{DBIT1}$) does not increase the necessary transmission bandwidth beyond the allotted baseband bandwidth ($f_{BW}$). Furthermore, as mentioned before, by realizing that there is an energy null at the baud rate, the magnitude of the maximum symbol rate ($R_{BAUDMAX}$) is set to equal the magnitude baseband bandwidth frequency ($f_{BW}$); in turn, by using the surplus baseband bandwidth spectral energy (i.e., the spectral energy from a frequency whose magnitude equals the magnitude of $R_{DBAUDMAX}$ to $f_{BW}$) to add descriptive bits to the information stream, encoder/decoder apparatus 10 can transmit baseband data at a high bit rate ($R_{DBIT1}$) while maintaining the BER and hamming distance associated with a lower bit rate ($R_{DBIT2}$).

Modulator 20 then supplies the modulated symbols to filter 26 for filtering out out-of-baseband bandwidth frequency components of the pulse amplitude modulated symbols, which have a sinc ((sin X)/X) frequency response. Transmitter 28 of encoder 12 then uses transmission medium 14 to transmit the sequence of symbols to receiver 30 of decoder 16 at the symbol transmission rate ($R_{BAUD}$). Clearly, the symbol transmission rate ($R_{BAUD}$) does not need to equal its maximum value ($R_{BAUDMAX}$). However, encoder/decoder 10 is optimally utilized by the embodiments that transmit symbols at the maximum symbol transmission rate ($R_{BAUDMAX}$), because such embodiments not only maximize the data throughput rate, but also maximize the descriptive bit rate in order to improve the BER and hamming distance for that data throughput rate. In addition, the transmission of symbols at the maximum symbol rate ($R_{BAUDMAX}$) simplifies the design of filter 26, because it pushes the spurious harmonic responses (in the sinc response of the PAM symbols) out of the baseband bandwidth and into the higher frequency region, which thereby allows filter 26 to have smaller and cheaper reactive elements.

In turn, receiver 30 supplies the received sequence of symbols to filter 32, which filters out the out-of-bandwidth noise that was picked up during the transmission of the symbols. Filter 32 then supplies the sequence of received symbols to automatic gain control (i.e., AGC) 34. AGC 34 increases the dynamic range of the transmitted symbols by providing a coarse compensation for attenuation due to the transmission. More specifically, since different transmission mediums have different characteristics which can cause different degrees of signal degradation (e.g., different lengths of the transmission cables can cause different degrees of signal degradation), decoder 16 has automatic gain control 34 (1) for performing an averaging function on a predetermined number of the transmitted symbols, (2) for comparing the computed average with a fixed reference signal on the AGC, and (3) for adjusting the levels of the incoming attenuated symbols to predetermined levels based on the comparison of the average with the fixed reference signal.

AGC 34 next supplies the coarsley adjusted symbols to quantizer 24, which samples the symbols at a sampling frequency equal to or greater than the Nyquist sampling frequency of 60 MHz ($f_N \geq 2 \times f_{BW}$). Quantizer 24 then supplies the sampled symbols to equalizer 36 which compensates for attenuations and group delays of the higher frequency components of the incoming symbols. The incoming symbols are then converted into digital bit pulses by demodulator 38. More specifically, demodulator 38 samples the incoming symbols at a clock rate determined by clock recovery circuit 62, and compares these samples to predetermined levels in order to demodulate the incoming symbols into bit pulses having the bit transmission rate ($R_{DBIT1}+R_d$). Bit stripper 40 then receives the digital output of demodulator 38 and performs the necessary descriptive bit detection. Bit stripper 40 then removes the descriptive bits and supplies the data bits at the first data bit rate ($R_{DBIT1}$) to data sink 46. Bit stripper 40 also supplies its output to clock recovery circuit 42, which in turn uses this output to determine the frequency of the incoming waves.

Finally, it should be noted that encoder/decoder apparatus 10 could also use a non-return to zero PCM coding scheme, since such coding schemes also cause a energy null to occur in the frequency domain at the frequency whose magnitude equals the magnitude of the baud rate. It should be further noted that encoder/decoder apparatus 10 could also use a return to zero PCM coding scheme or a phase encoded PCM coding scheme. More specifically, encoder 12 could transmit return to zero PCM symbols or phase encoded PCM symbols to decoder 16 if the magnitude of the maximum baud rate ($R_{BAUDMAX}$) is set to equal the magnitude of one half of the baseband bandwidth frequency ($f_{BW}$). Descriptive bits can then be added to increase the baud rate from the maximum data baud rate to the maximum baud rate, in order to use the entire surplus spectral energy in the bandwidth to transmit baseband data at a high bit rate while maintaining the bit error rate and the hamming distance associated with a lower bit rate.

100 MBit Four Twisted Pair Full-Duplex Ethernet Network

Figure 2:
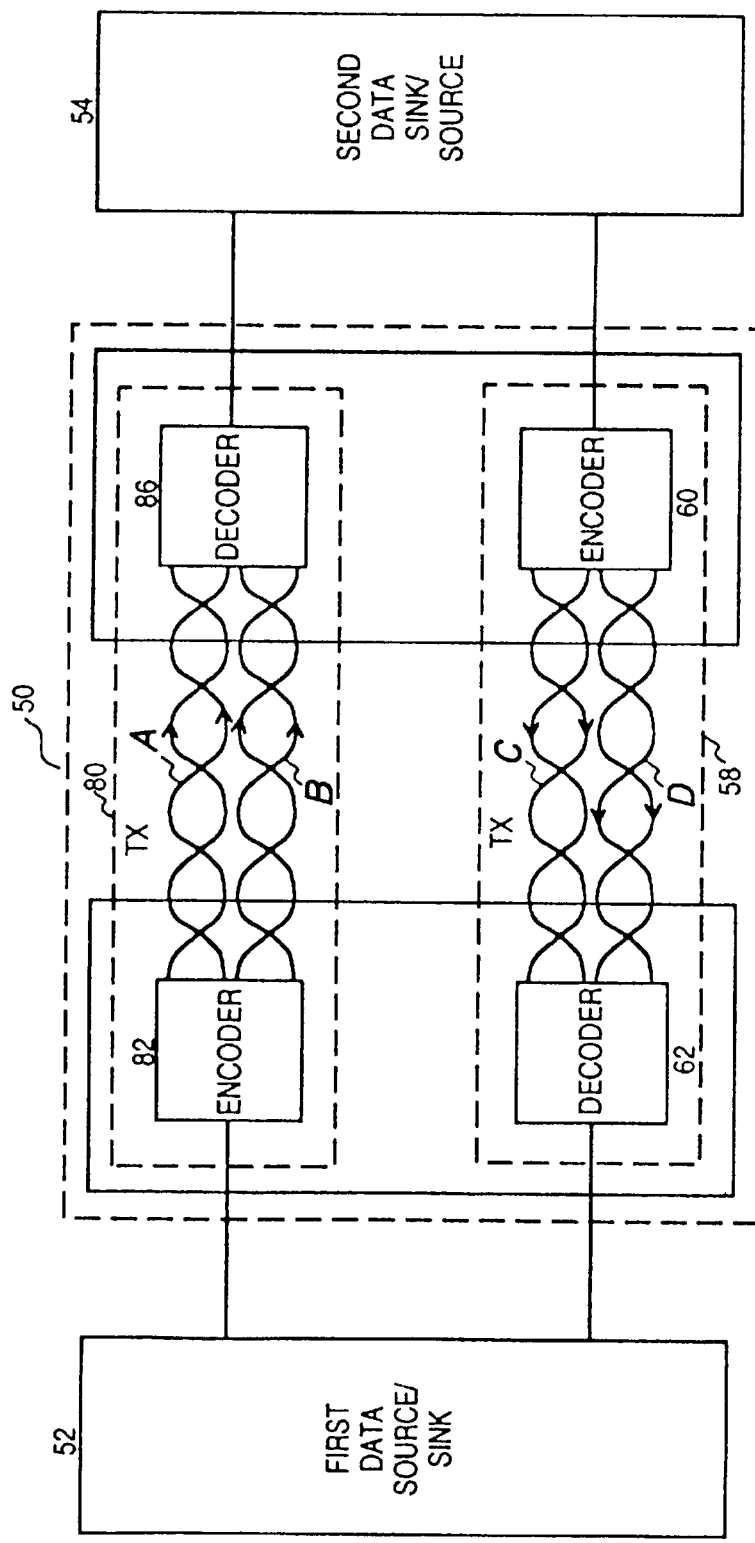
FIG. 2 is a another embodiment of the encoder/decoder apparatus of the present invention, which is a 100 MBit four twisted pair full-duplex Ethernet network.
Figure 3:
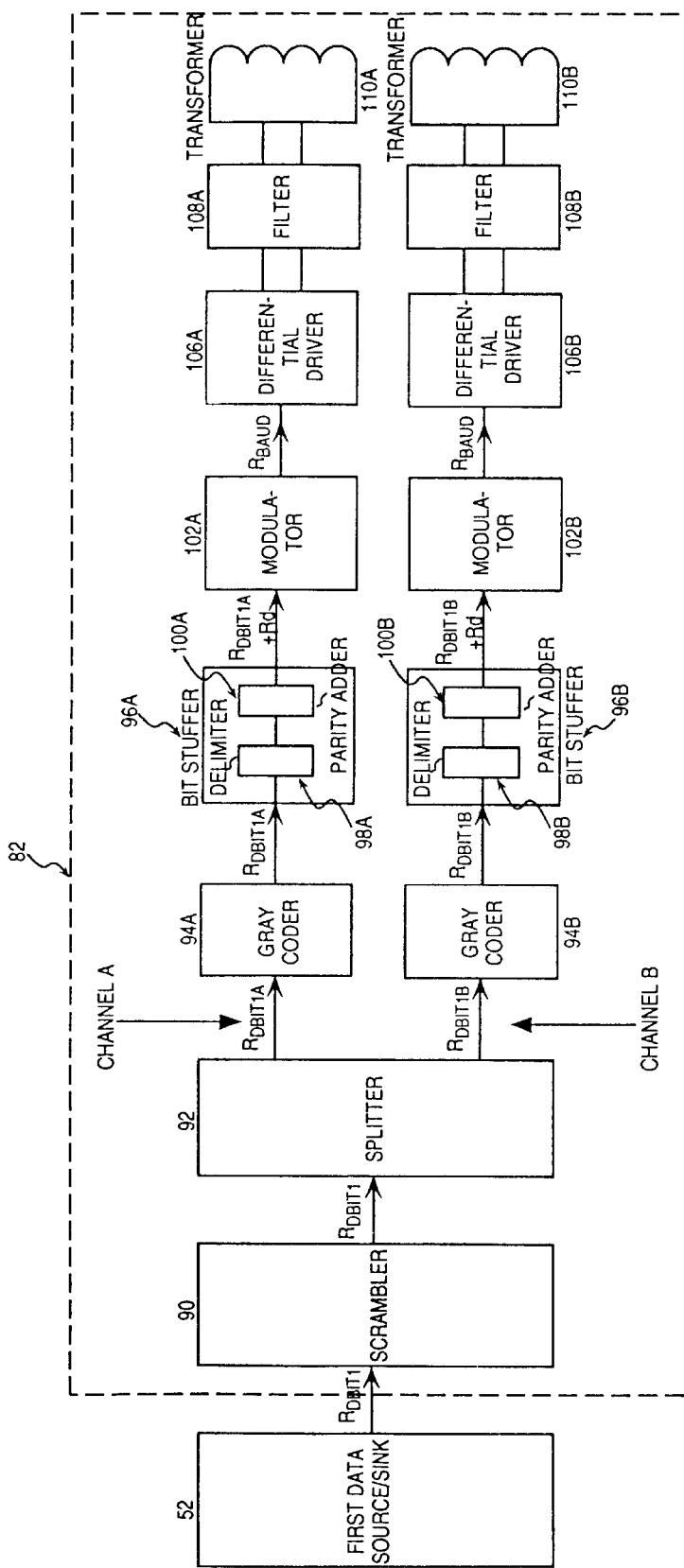
FIG. 3 is one embodiment of an encoder used in the encoder/decoder apparatus of FIG. 2.
Figure 4:
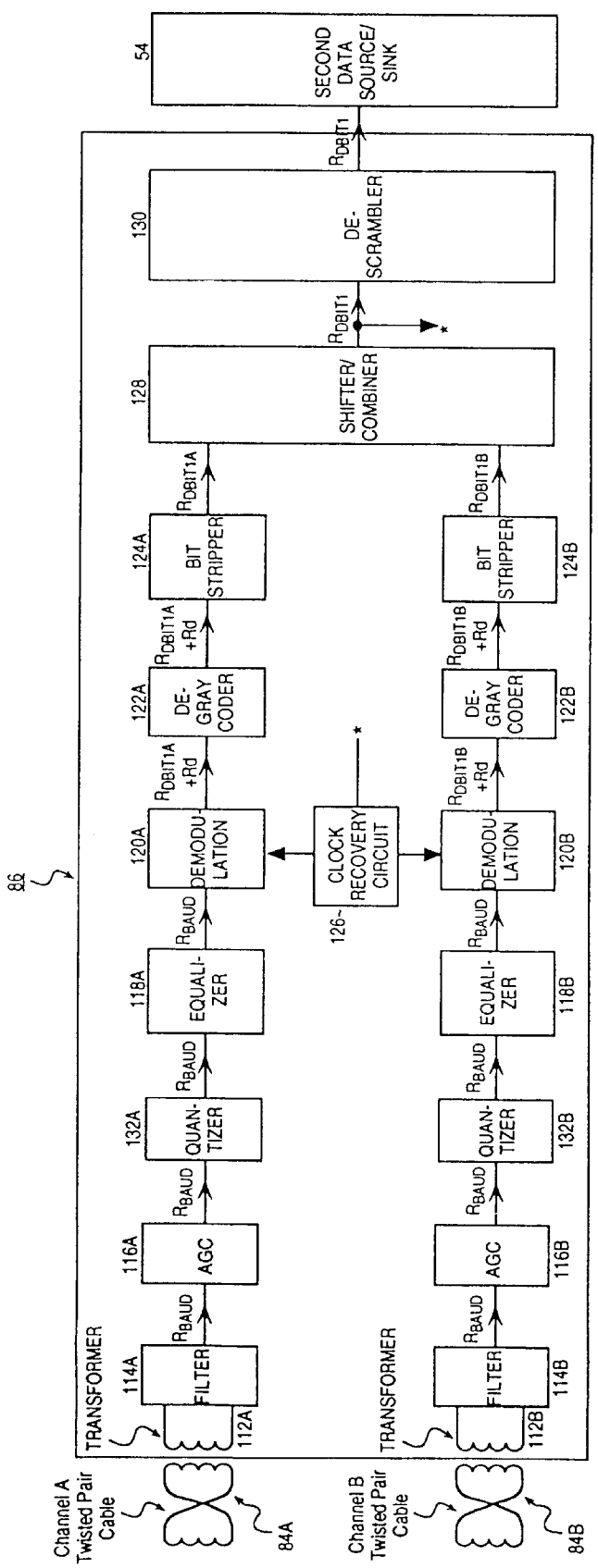
FIG. 4 is one embodiment of the decoder used in the encoder/decoder apparatus of FIG. 2.

FIGS. 2–4 present another embodiment of the encoder/decoder apparatus of the present invention. FIG. 2 presents encoder/decoder system 50 that couples a first data source/sink 52 to a second data sink/source 54. Encoder/decoder system 50 is a 100 MBit Ethernet encoding/decoding system, which utilizes a multilevel baseband code with three or more levels to send a maximum of 100 MBit/s of data over four twisted pairs in a full-duplex mode (i.e., two twisted pairs A and B transmit data from first data source/sink 52 to second data sink/source 54, while two twisted pairs C and D transmit data from second data sink/source 54 to first data source/sink 52).

Like the 10 MBit Ethernet network, 100 MBit Ethernet encoder/decoder system 50 is a baseband system, which renders it compatible with the 10 MBit Ethernet networks. In addition, in order to maintain backward compatibility with the 10 MBit Ethernet systems that comply with IEEE 802.3 standard and in order to comply with FCC's Part 15B requirement, Ethernet system 50 is designed to have (1) a BER at or below $10^{-9}$ and a hamming distance at or above four for a minimum cable length of 100 meters, and (2) a maximum baseband bandwidth of 30 MHz.

Encoder/decoder system 50 includes a first encoder/decoder apparatus 80 and a second encoder/decoder apparatus 58. The first encoder/decoder apparatus 80 includes encoder 82, twisted pair cables A and B, and decoder 86. Similarly, second encoder/decoder apparatus 58 includes encoder 60, twisted pair cables C and D, and decoder 62. FIGS. 3 and 4 present a more detailed view of first encoder/decoder apparatus 80, which transmits data received from first data source/sink 52 to second data sink/source 54. FIGS. 3 and 4 only present half of the encoder/decoder system 50, in order not to obscure the present invention with unnecessary detail. However, it will be understood by one of ordinary skill in the art that the following discussion of FIGS. 3 and 4 is equally applicable to second encoder/decoder apparatus 58, which transmits data received from second data sink/source 54 to first data source/sink 52.

As shown in FIGS. 3 and 4, encoder 82 transmits to decoder 86 pulse amplitude modulated symbols at a baud rate ($R_{BAUD}$). Since the frequency response of multilevel PAM scheme with three or more levels has an energy null at the frequency whose magnitude equals the magnitude of the baud rate, and since FCC's Part 15B standard limits the baseband bandwidth to 30 MHz (i.e., requires an effective energy null at 30 MHz), encoder/decoder apparatus 80 sets the magnitude of the maximum baud rate to 30 MBauds/s (i.e., $R_{BAUDMAX}=R_{BAUDMAXA}=R_{BAUDMAXB}=30$ MBaud/s). Encoder 82 transmits to decoder 86 PAM symbols (across twisted pair cables A and B) at the maximum baud rate ($R_{BAUDMAX}$) of 30 MBaud/s, when data source 52 supplies data (to scrambler 90 of encoder 82) at a maximum data bit rate ($R_{DBITMAX}$) of 100 MBits/s and bit stuffers 96 add descriptive bits to the data bit stream at a maximum descriptive bit rate ($R_{dMAX}$).

In turn, the maximum baud rate ($R_{BAUDMAX}$) determines a maximum bit rate ($R_{BITMAX}$) by a simple relationship based on the specific coding scheme used by modulators 102. It should be noted that the simple relationship relating the maximum baud rate ($R_{BAUDMAX}$) and the maximum bit rate ($R_{BITMAX}$), also relates a maximum data baud rate ($R_{DBAUDMAX}$) with the maximum data bit rate ($R_{DBITMAX}$). For example, as described below, if modulators 102 use a 2B-1Q coding scheme, the maximum data bit rate and the maximum bit rate respectively will be twice the maximum data baud rate and the maximum baud rate (e.g., $R_{DBITMAX}=2*R_{DBAUDMAX}$, and $R_{BITMAX}=2*R_{BAUDMAX}$).

Referring now more specifically to FIGS. 3 and 4, scrambler 90 of encoder 82 receives data bits from the first data source/sink 52 at a first data bit rate ($R_{DBIT1}$), which at most equals 100 MBits/s. Scrambler 90 DC balances the serial data that it receives (i.e., it prevents the transmission of long periods of zeros or ones), because decoder 86 utilizes phase locked loop (or equivalent equalizer DSP based estimation) clock recovery circuit 126 which needs to receive DC balanced random data in order to realize the frequency of the incoming signals. Data scrambler 90 then supplies its scrambled output to splitter 92, which splits the input bit stream into a channel A output bit stream having a first channel A data bit rate ($R_{DBIT1A}$) and a channel B output bit stream having a first channel B data bit rate ($R_{DBIT1B}$). Also, referring back to FIG. 2, the second encoder/decoder apparatus 58 likewise has a data scrambler, and other associated components described in FIGS. 3 and 4 for encoder/decoder apparatus 80. Encoder/decoder apparatus 58 processes data symbols over twisted pair cables C and D (shown in FIG. 2). Twisted pair cable C has an associated channel C and twisted pair cable D has an associated channel D. Each of channels C and D also will have a baud rate, and symbols that are supplied to cables C and D are subject to a maximum baseband bandwidth frequency, similar to that described for symbols of twisted pair cables A and B. The maximum baud rates for channels C and D have at most, a magnitude equal to the magnitude of the baseband bandwidth frequency. For one embodiment of encoder/decoder apparatus 80, first channel A data bit rate and first channel B data bit rate are equal and have a maximum bit rate of 50 MBits/s (i.e., $R_{DBITMAXA}=R_{DBITMAXB}=\frac{1}{2}*R_{BITMAX}=50$ MBits/s). It should be noted that the maximum bit rate ($R_{BITMAX}$) is related to a maximum channel A or B bit rate ($R_{BITMAXA}$ or $R_{BITMAXB}$) by the same relationship that relates the maximum data bit rate ($R_{DBITMAX}$) to the maximum channel A data bit rate ($R_{DBITMAXA}$). Thus, for example, if the input to splitter 92 was the following bit stream, 00101100, the output on channels A and B would be:

Channel A output 0110

Channel B output 0010.

In other words, for every pair of input bits, splitter 92 delays outputting the first bit until it has received the second bit, at which time it outputs the first bit on channel A while outputting the second bit on channel B.

In the following discussion, reference is only made to the transmission of the data stream along channel A, in order not to obscure the present invention with unnecessary detail. However, one of ordinary skill in the art will understand that the following discussion is equally applicable to the processing of data along channel B. Likewise, the following discussion is equally applicable to processing of data along channels C and D.

Splitter 92 then supplies its output to gray coder 94a, which changes the values of some of the incoming bits based on a gray coding scheme. Gray coding is a method for reducing bit errors by selecting adjacent levels of modulated pulses to differ by at most one bit. For example, for the embodiments of encoder/decoder apparatus 80 that use a 2B-1Q coding scheme, Table 1 sets forth one manner of gray level coding designed to operate with a conventional four level (2B-1Q) linear modulator, whose modulation scheme is set forth in Table 2.

TABLE 1

| Pulse Level in Volts | Value of the Bits Corresponding to the Pulse Level |
|---|---|
| 5 | 11 |
| 3.3 | 01 |
| 1.6 | 00 |
| 0 | 10 |

TABLE 2

| Pulse Level in Volts | Value of the Bits Corresponding to the Pulse Level |
|---|---|
| 5 | 11 |
| 3.3 | 10 |
| 1.6 | 01 |
| 0 | 00 |

Thus, if gray coder 94a receives the following input stream,

0|0|1|1|1|0|0|1|0|0 the gray coder output would be

0|1|1|1|0|0|1|0|0|1

The output of gray coder 94a is then supplied to bit stuffer 96a, which in turn adds descriptive bits at a descriptive bit rate ($R_d$) to the stream of data bits. For the embodiment of encoder/decoder apparatus 80 that is shown in FIGS. 3 and 4, bit stuffer 96a includes delimiter 98a and parity adder 100a. However, it will be understood by one of ordinary skill in the art that bit stuffer 96a could include alternative error detection/correction circuitry.

Delimiter 98a is used in encoder 82 because some multilevel coding schemes (such as the 2B-1Q coding scheme), used by encoder/decoder apparatus 80, require start and stop delimiters to determine the initiation and termination of a data transmission. More specifically, delimiter 98a awaits a unique five bit code, that is assigned to be the start code, in order to enable parity bit adder 100a by supplying a six bit code to parity bit adder 100a. On the other hand, once the parity bit adder is enabled, delimiter 98a awaits a unique five bit stop code to disable parity bit adder 100a by supplying a six bit disable code to the parity bit adder.

Once delimiter 98a enables parity bit adder 100a, the parity adder adds parity bits to the data stream, in order to maintain the BER (at or below $10^{-9}$) and hamming distance (at or above 4) associated with a second lower data bit rate ($R_{DBIT2}$, e.g., 10 MBits/s) while increasing the data rate from the second lower data bit rate to the first data bit rate ($R_{DBIT1}$, which has a maximum value of 100 MBits/s). More specifically, parity bits are added in order to prevent the increase of the bit rate (i.e., the increase from 10 MBits/s to 100 MBits/s) from increasing the BER beyond $10^{-9}$. For one embodiment of the present invention, channel A is an odd parity check channel, while channel B is an even parity check channel. The use of an odd and even parity check channels is advantageous from a burst error point of view, because it allows the detection of unidirectional burst errors of any size.

In turn, by maintaining the BER at or below $10^{-9}$, the addition of the parity bits also helps maintain the required hamming distance of 4. The established 10 MBit Ethernet protocol allows a maximum data packet size of 1562 bytes plus a 32 bit cyclical redundancy check code, which provides for a hamming distance of 4 or greater when the bit rate equals 10 MBits/s. However, as the bit rate increases, the BER also increases, which in turn reduces the hamming distance below 4. Consequently, encoder/decoder apparatus 80 maintains the desired hamming distance by using the parity bit error detection mechanism to prevent the BER from increasing and thereby reducing the hamming distance below 4.

Bit stuffer 96a adds descriptive bits to the stream of data bits at a descriptive bit rate ($R_d$) which at most equals a maximum channel A bit frequency minus the maximum channel A data bit frequency (i.e., $R_{dMAXA}=R_{BITMAXA}-R_{DBITMAXA}$). In other words, bit stuffer 96a uses the surplus spectral energy in the bandwidth (i.e., the spectral energy from the frequency whose magnitude equals $R_{DBAUDMAX}$ to $f_{BW}$, which corresponds to the spectral energy in the bit bandwidth from a frequency whose magnitude equals the magnitude of $R_{DBITMAXA}$ to a frequency whose magnitude equals the magnitude of $R_{BITMAXA}$) to add both parity and delimiter bits, in order to maintain the BER and hamming distance associated with 10 MBit/s rate, while transmitting data at 100 MBit/s rate. For example, for the embodiment of encoder/decoder apparatus 80 which use a 2B-1Q coding scheme, the maximum descriptive bit rate ($R_{dMAX}$) is 10 MBits/s, because the maximum data bit transmission rate for each channel ($R_{DBITMAXA}$ and $R_{DBITMAXB}$) is 50 MBits/s and because the maximum bit bandwidth frequency is 60 MHz (since FCC's Part 15B requirement limits the symbol bandwidth frequency to 30 MHz and since 2B-1Q coding scheme sets the bit bandwidth frequency to be twice as much as the symbol bandwidth frequency).

Bit stuffer 96a then supplies the information stream to modulator 102a at a bit transmission rate (i.e., $R_{DBIT1A}+R_d$). The modulator in turn encodes the bit stream into a plurality of PAM symbols having a symbol transmission rate ($R_{BAUD}$). As mentioned before, modulator 102a uses a multilevel baseband code with three or more levels to represent a plurality of bits as one symbol, so that an increase in the data rate from 10 MBits/s to 100 MBits/s does not increase the necessary transmission bandwidth beyond the allotted baseband bandwidth ($f_{BW}$) of 30 MHz. Furthermore, by realizing that there is an energy null at the baud rate, the magnitude of the maximum symbol rate ($R_{BAUDMAX}$=30 MBauds/s) is set to equal the magnitude of the baseband bandwidth frequency ($f_{BW}$=30 MHz), so that the surplus baseband spectral energy (i.e., the spectral energy from a frequency whose magnitude equals the magnitude of $R_{DBAUDMAX}$ (25 MHz) to $f_{BW}$ (30 MHz)) can be used to add descriptive bits to the information stream, in order to maintain the BER and hamming distance associated with the 10 MBits/s bit rate while transmitting baseband data at a 100 MBits/s bit rate.

For one embodiment of encoder/decoder apparatus 80, modulator 102a uses a 2B-1Q coding scheme and thereby receives data from bit stuffer 96a at a maximum bit rate of 60 MBits/s (since FCC's Part 15B requirement limits the symbol bandwidth frequency to 30 MHz and since 2B-1Q coding scheme sets the bit bandwidth frequency to be twice as much as the symbol bandwidth frequency). Modulator 102a then encodes the information stream into a plurality of symbol pulses, each of which represents two binary bits and can have any one of four values. Since each symbol represents two bits, the maximum symbol rate is one half of the maximum bit rate (i.e., $R_{BAUDMAX}$=30 MBauds/s and $R_{BITMAX}$=60 MBits/s). In other words, by using the 2B-1Q coding scheme, encoder/decoder apparatus 80 can transmit 100 MBits/s of data and 20 MBits/s of parity/delimiter bits over two twisted pairs, while maintaining FCC's maximum symbol transmission bandwidth of 30 MHz. It should be noted that this four level (2B-1Q) code is used by one embodiment of encoder/decoder apparatus 80, because this four level code requires a relatively low signal to noise ratio (SNR) while providing a high bit rate.

The modulated waves are then supplied to differential driver 106a which converts the input voltage into differential output currents. These output currents are then supplied to transformer 110a via filter 108a, which filters out out-of-baseband frequency components of the pulse amplitude modulated symbols, which have a sinc ((sinx x/x)) frequency response. Transformer 110a, which is center tapped to VDD, is current mode driven. Thus, the differential output currents of differential driver 106a differentially drive transformer 110a in order to transfer the output signals of the differential driver to twisted pair cable A. Twisted pair cable A then supplies the signal to transformer 112a of decoder 86 at a maximum symbol rate of 30 MBaud/s.

Clearly, the symbol transmission rate ($R_{BAUD}$) does not need to equal its maximum value ($R_{BAUDMAX}$) of 30 MBaud/s. However, encoder/decoder apparatus 80 is optimally utilized by the embodiments that transmit symbols at the maximum symbol transmission rate of 30 MBaud/s, because such embodiments not only maximize the data throughput rate, but also maximizes the descriptive bit rate in order to improve the BER and hamming distance for that data throughput rate. In addition, the transmission of symbols at the maximum symbol transmission rate ($R_{BAUDMAX}$) simplifies the design of filter 108a, because it pushes the spurious harmonic responses (in the sinc response of the PAM symbols) out of the baseband bandwidth and into the higher frequency region, which thereby allows filter 108a to have smaller and cheaper reactive elements.

Transformer 112a next supplies the received sequence of symbols to filter 114a, which filters out the out-of-baseband noise that was picked up during transmission of the symbols. Filter 114a then supplies the sequence of received symbols to automatic gain control 116a. AGC 116a increases the dynamic range of the transmitted symbols by providing a coarse compensation for attenuation due to the transmission. More specifically, since different lengths of transmission cables can cause different degrees of attenuation, decoder 86 has automatic gain control 116a (1) for performing an averaging function on a predetermined number of the transmitted symbols, (2) for comparing the computed average with a fixed reference signal in the AGC, and (3) for adjusting the levels of the attenuated pulses to the predetermined levels based on the comparison of the average with the fixed reference signal.

In turn, AGC 116a supplies the coarsley adjisted symbols to quantizer 132a, which samples the symbols at a sampling frequency equal to or greater than the Nyquist sampling frequency of 60 MHz ($f_N \geq 2*f_{BW}$). Quantizer 132a then supplies the sampled symbols to equalizer 118a, which compensates for amplitude and phase degradation of the higher frequency components of the incoming symbols. The incoming symbols are then converted into digital bit pulses by demodulator 120a. More specifically, demodulator 120a samples incoming symbols at a clock rate determined by clock recover circuit 126, and compares these samples to predetermined levels, in order to demodulate the incoming symbols into bit pulses having a bit transmission rate. For example, for the embodiments of the present invention that use a 2B-1Q coding scheme, demodulator 120a demodulates the incoming waves into digital bit pulses having a frequency of 60 MHz. De-gray coder 122a then receives the digital output of demodulator 120a and performs the necessary de-gray coding. For example, for the embodiments of the present invention that use a 2B-1Q coding scheme and that use gray coder 94a whose manner of level gray coding is set forth in Table 1, if de-gray coder 122a received the following input stream:

0|1|1|1|0|0|1|0|0|1, its output would be:

0|0|1|1|1|0|0|1|0|0.

Bit stripper 124a then receives the digital output of de-gray coder 122a and performs the necessary delimiter/parity detection. Bit stripper 124a then removes the parity/delimiter bits and supplies the data bits at the first channel A data bit rate ($R_{DBIT1A}$) to shifter/combiner 128. Shifter/combiner 128 delays its input on channel B for a sufficient amount of time so as to allow it to interlace the signals on channel A and B. For example, if the inputs on channel A and B were as follows, Channel A input: 0|1|1|0
Channel B input: 0|0|1|0
the shifter of combiner 128 would delay the signals on channel B for half a period as shown below,
Channel A input: 0|1|1|0
Channel B input: 0|0|1|0
The interlacer of combiner 128 would then combine the signals on channel A and B so as to produce the following output: 00101100.

Combiner 128 then supplies its output to phase locked loop (or equivalent equalizer DSP based estimation) clock recovery circuit 126, which in turn uses this output to determine the frequency of the incoming symbols. Combiner 128 also supplies its output to descrambler 130 in order for second data node 54 to receive the transmitted signals as they existed prior to being scrambled by scrambler 90.

The above-mentioned 100 MBit Ethernet encoding/decoding system 50 can readily be implemented in the United States because it is adaptable to the available present-day Ethernet infrastructure in the United States. More specifically, since the 100 MBit Ethernet network 50 provides bi-directional transmissions with four twisted pairs (i.e., twisted pairs A, B, C, and D), no additional wiring needs to be placed between hubs and repeaters. Furthermore, by operating at a maximum baud rate of 30 MBaud/s, this 100 MBit Ethernet implementation optimally utilizes the 30 MHz bandwidth that the FCC allows, in order to maximize the data throughput rate and minimize the BER and maximize the hamming distance for that data throughput rate by maximizing the descriptive bit rate.

100 MBit Two Twisted Pair Half-Duplex Ethernet Network

Figure 6:
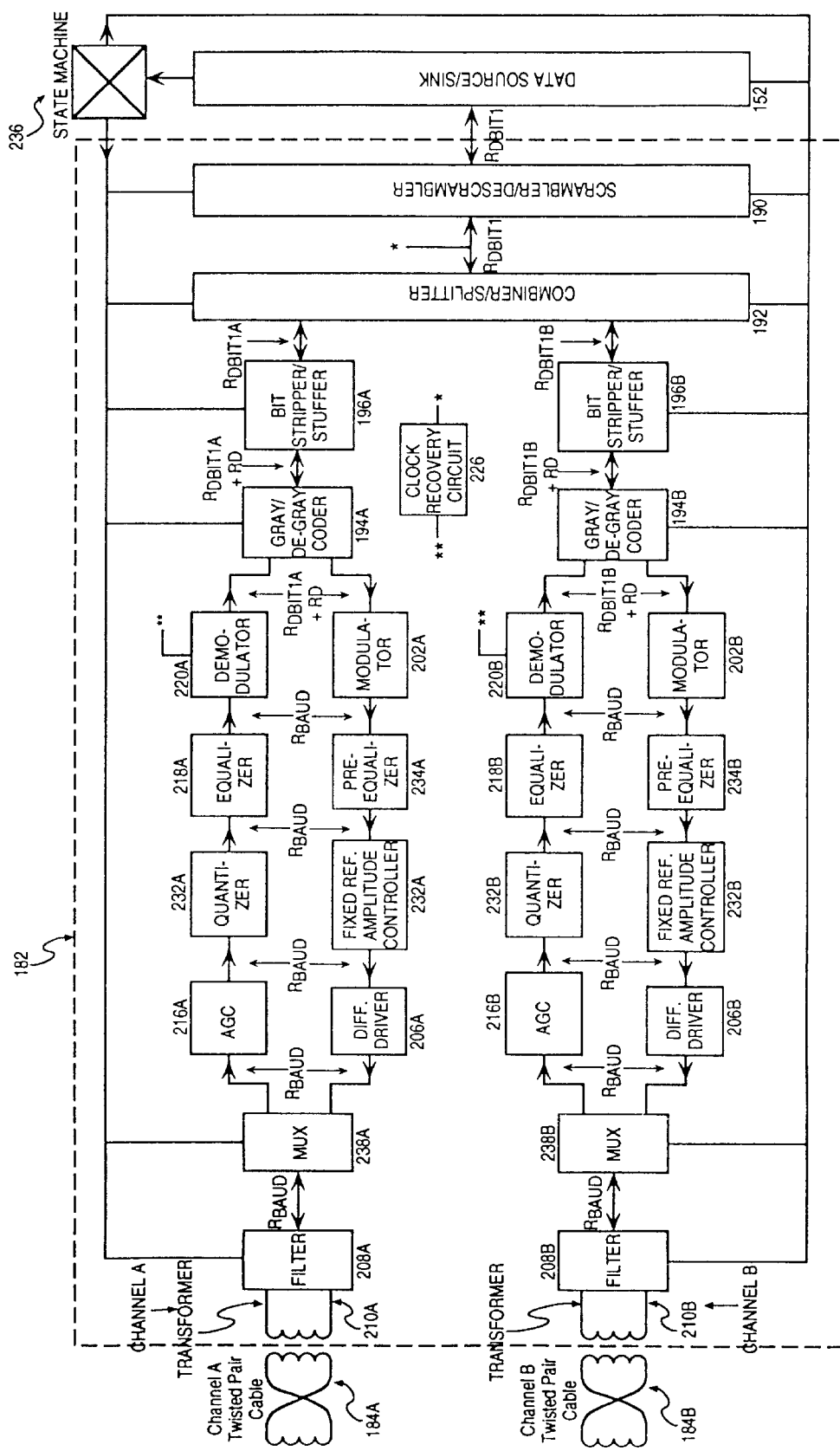
FIG. 6 is one embodiment of the encoder/decoder of the encoding/decoding apparatus of FIG. 5.

FIGS. 5 and 6 present another detailed embodiment of the encoder/decoder apparatus 10 of FIG. 1. FIG. 5 presents encoder/decoder system 150 that couples the first data source/sink 152 to a second data sink/source 154. Encoder/decoder system 150 is a 100 MBit Ethernet encoding/decoding system, which utilizes a multilevel baseband code with three or more levels to send a maximum of 100 MBits/s of data over two twisted pairs in a half-duplex mode (i.e., at any one time, twisted pairs 184a and 184b either both transmit data from first data source/sink 152 to second data sink/source 154 or both transmit data from second data sink/source 154 to first data source/sink 152).

Like the 10 MBit Ethernet network, 100 MBit Ethernet encoder/decoder system 150 is a baseband system, which renders it compatible with the previous 10 MBit Ethernet networks. In addition, in order to maintain backward compatibility with the 10 MBit Ethernet systems that comply with IEEE 802.3 standard and in order to comply with FCC's part 15 requirement, Ethernet system 150 is designed to have (1) a BER at or below $10^{-9}$ and a hamming distance at or above four for a minimum cable length of 100 meters, and (2) maximum baseband bandwidth of 30 MHz.

Encoder/decoder system 150 includes encoder/decoder 182, twisted pair cables 184, and decoder/encoder 186. FIG. 6 presents a more detailed view of encoder/decoder 182. Because decoder/encoder 186 is identical to encoder/decoder 182, FIG. 6 only presents a detailed view of encoder/decoder 182, in order not to obscure the description of the present invention with unnecessary detail. However, it will be understood by one of ordinary skill in the art that the following discussion of FIG. 6 is equally applicable to decoder/encoder 186.

Encoder/decoder 150 is capable of operating in a half-duplex mode because both encoder/decoder 182 and decoder/encoder 186 can serve as either an encoder or a decoder. For example, data source/sink 152 can request state machine 236 to cause encoder/decoder 182 to operate as an encoder by providing a first predetermined signal (e.g., a high signal) to filters 208, multiplexors 238, gray/de-gray coders 194, bit strippers/stuffers 196, combiner/splitter 192, and scrambler/descrambler 190. It should be noted that by controlling multiplexors 238, state machine 236 controls the operation of AGCs 216, quantizers 232, equalizers 218, demodulators 220, differential drivers 206, fixed reference amplitude controllers 232, pre-equalizers 234, and modulators 202. When encoder/decoder 182 operates as an encoder, it supplies the data that it receives from first data source 152 to twisted pairs 184 via the scrambler of scrambler/ descrambler 190, the splitter of combiner/splitter 192, the bit stuffers of bit strippers/stuffers 196, the gray coders of gray/de-gray coders 194, modulators 202, pre-equalizers 234, fixed reference amplitude controllers 232, differential drivers 206, filters 208, and transformers 210.

In addition, data source/sink 152 can request state machine 236 to cause encoder/decoder 182 to operate as a decoder by providing a second predetermined signal (e.g., a low signal) to the transformers 210, filters 208, multiplexors 238, gray/de-gray coders 194, bit strippers/stuffers 196, combiner/splitter 192, and scrambler/descrambler 190. When encoder/decoder 182 operates as a decoder, it supplies the data that it receives from twisted pairs 184 to first data sink 152 via filters 208, AGCs 216, quantizers 232, equalizers 218, demodulators 220, the de-gray coders of gray/de-gray coders 194, the bit strippers of bit strippers/stuffers 196, the combiner of combiner/splitter 192, and the descrambler of scrambler/descrambler 190.

When encoder/decoder 182 operates as an encoder, the discussion pertaining to the operation of scrambler 90, splitter 92, gray coder 94a, bit stuffer 96a, modulator 102a, differential driver 106a, filter 108a, and transformers 110 of encoder 82 of FIG. 3 applies in its entirety to the operation of the scrambler of scrambler/descrambler 190, the splitter of combiner/splitter 192, the bit stuffers of bit strippers/ stuffers 196, the gray coders of gray/de-gray coders 194, modulators 202a, differential drivers 206, filters 208, and transformers 210 of encoder/decoder 150 of FIG. 5. In addition, as shown in FIG. 6, encoder/decoder 182 also includes pre-equalizer 234 and fixed reference amplitude controllers 232 in its encoding path. Pre-equalizers 234 are used in order to optimize the equalization process by splitting the equalization compensation between the transmission and reception stages. Pre-equalizers 234 adjust the amplitude and phase response of the outgoing symbols either based on an approximation of the twisted pair cable length, or based on an adaptive technique like the V. fast technique. Fixed reference amplitude controllers 232 are used to assure that minor variation in the output of modulators 202 do not decrease the dynamic range of the symbols.

Furthermore, when encoder/decoder 150 operates as a decoder, the discussion pertaining to the operation of transformers 112, filter 114a, AGC 116a, quantizer 132a, equalizer 118a, demodulator 120a, de-gray coder 122a, bit stripper 124a, combiner 128, descrambler 130 of decoder 86 of FIG. 4 applies in its entirety to the operation of transformers 210, filters 208, AGCs 216, quantizers 232, equalizers 218, demodulators 220, the de-gray coders of gray coders/de-gray coders 194, the bit strippers of bit strippers/stuffers 196, the combiner of combiner/splitter 192, and the descrambler of scrambler/descrambler 190 of encoder/decoder 150 of FIG. 5.

In addition, similarly to encoding/decoding system 50 of FIGS. 2–4, encoding/decoding system 150 is a 100 MBit Ethernet encoding/decoding system that maintains the desired bandwidth (30 MHz), BER (at or below $10^{-9}$), and hamming distance (at or above 4) associated with a lower bit rate of 10 MBits by (1) using a multilevel coding scheme with three or move levels, (2) realizing that the frequency response of multilevel PAM scheme with three or more levels has a spectral energy null at the frequency whose magnitude equals the magnitude of the baud rate, (3) having a maximum baud rate whose magnitude equals the magnitude of the baseband bandwidth frequency (i.e., $R_{BAUDMAX}$= 30 MBauds/s), and (4) using the surplus bandwidth spectral energy (i.e., the spectral energy from 25 MHz to 30 MHz) to add parity/delimiter bits to the information stream.

For example, for the embodiments of encoder/decoder apparatus 150 which use a 2B-1Q coding scheme, encoder/ decoder apparatus 150 transmits data at a maximum data rate of 100 MBits/s and transmits descriptive bits at a maximum descriptive bit rate of 20 MBits/s over two twisted pairs (i.e., each twisted pair operates at a maximum baud rate of 30 MBauds/s, or alternatively stated at a maximum bit rate of 60 MBits/s) in a half-duplex mode, in order to maintain the transmission bandwidth of 30 MHz, the BER at or below $10^{-9}$, and the hamming distance at or above four. In addition, like encoder/decoder apparatus 80, encoder/ decoder system 150 sets one channel (e.g., channel A) as the odd parity check channel while setting the other channel (e.g., channel B) as the even parity check channel, in order to reduce the BER due to burst errors.

Also, like Ethernet encoding/decoding system 50 of FIGS. 2–4, Ethernet encoding/decoding system 150 of FIGS. 5 and 6 can readily be implemented in the United States because it is readily adaptable to the present-day Ethernet infrastructure in the U.S. More specifically, since this 100 MBit Ethernet system uses only 2 twisted pairs to provide unidirectional transmissions, no additional twisted pairs need to be placed between hubs and repeaters and between repeaters, because the four twisted pairs that already couple each data node can be used to provide bi-directional transmissions between hubs and repeaters and between pairs of repeaters. In addition, this two twisted pair half-duplex Ethernet system can easily be adopted in foreign countries, which only use two twisted pairs in their Ethernet networks to couple their communication nodes. Furthermore, because this Ethernet implementation uses two twisted pairs, it requires less electronic circuitry than an Ethernet network that uses four twisted pairs. Finally, while operating at a maximum baud rate of 30 MBauds/s, this 100 MBit Ethernet implementation optimally utilizes the 30 MHz bandwidth that the FCC allows, in order to maximize the data throughput rate while minimizing the BER and maximizing the hamming distance for that data throughput rate by maximizing the descriptive bit rate.

Repeater Application of the 100 MBit Ethernet Networks

Figure 7:
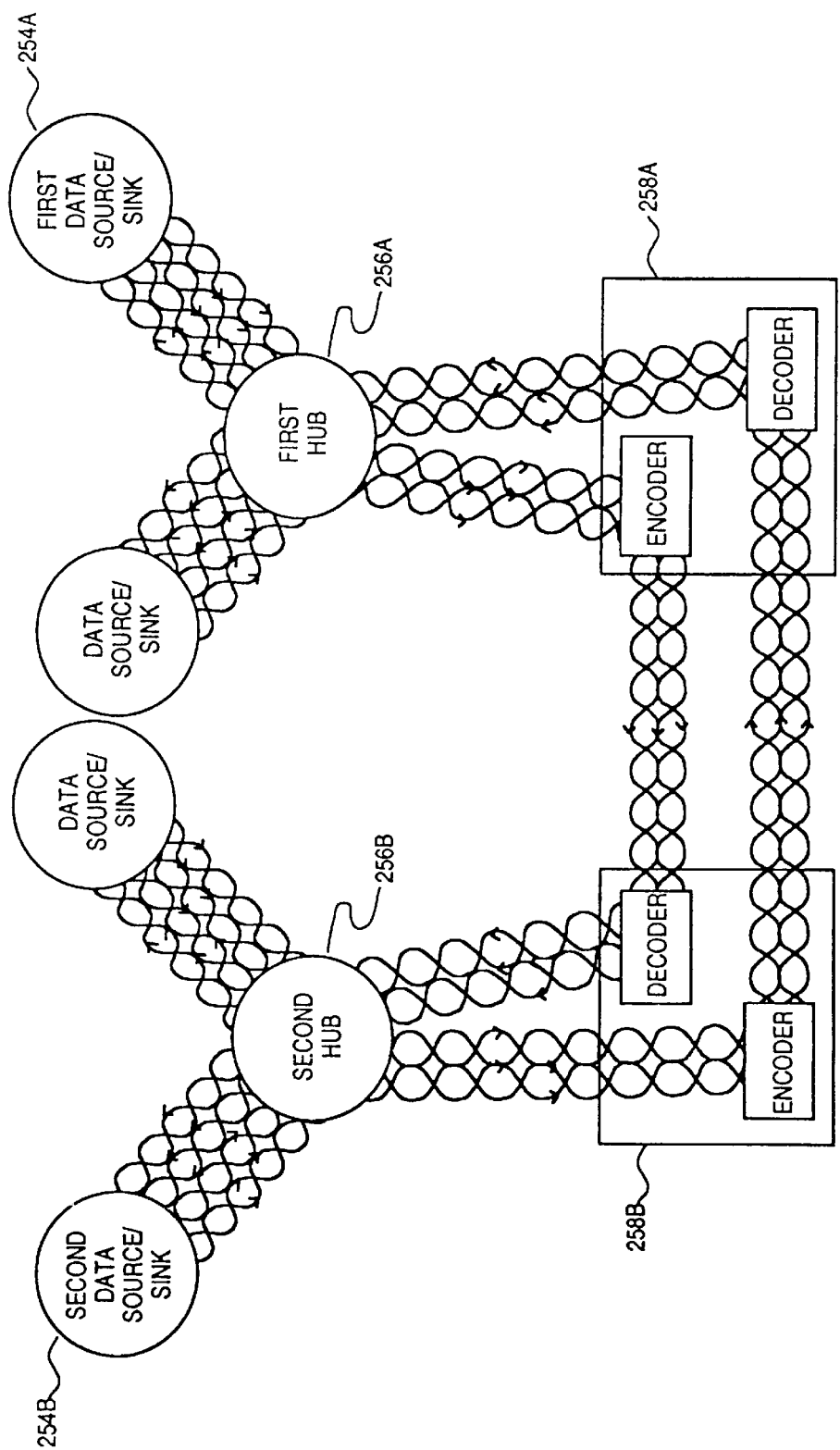
FIG. 7 presents the encoding/decoding apparatus of FIG. 2 positioned in repeater chips.
Figure 8:
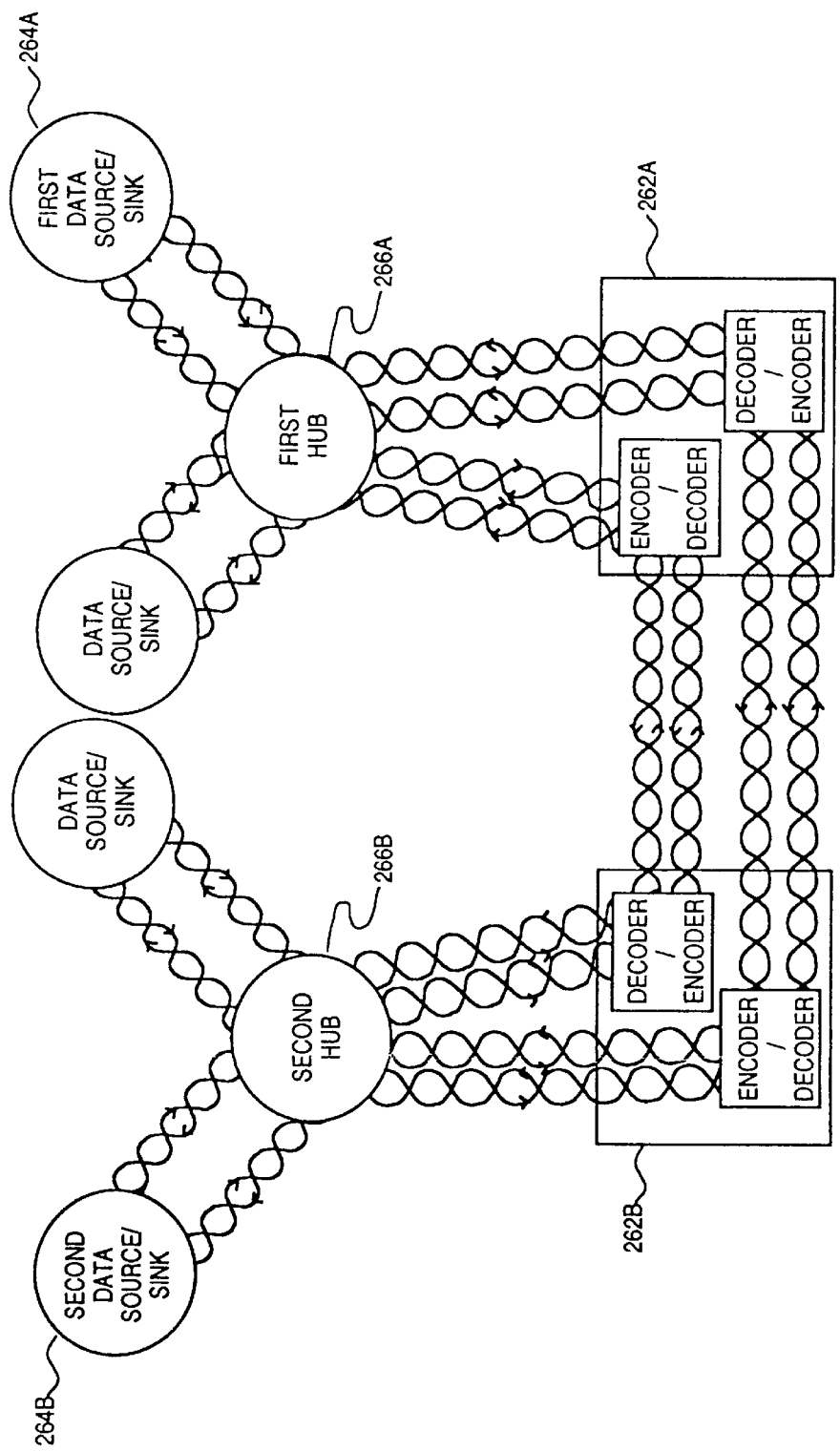
FIG. 8 presents the encoding/decoding apparatus of FIG. 5 positioned in repeater chips.

As apparent from the previous discussion, the Ethernet networks that are set forth in FIGS. 2–6 can be implemented at any location in the physical layer of the data communication system. For example, the encoders and decoders that are set forth in FIGS. 2–6 can be located adjacent their respective data nodes and their respective hubs. In addition, as set forth in FIGS. 7 and 8, for repeater applications the encoding and decoding systems of the present invention are not only located adjacent their respective data nodes and hubs, but are also placed inside the repeaters. FIG. 7 shows encoder/decoder system 50 (of FIGS. 2–4) in repeater chips 258. In other words, not only do data sources 254 and hubs 256 employ encoder/decoder system 50 to transmit data, but also repeaters 258 use encoder/decoder system 50 to relay data. On the other hand, FIG. 8 shows encoder/decoder system 150 (of FIGS. 5–6) in repeater chips 262. More specifically, not only do data sources 264 and hubs 266 use encoder/decoder system 150 to transmit data, but also repeaters 262 employ encoder/decoder system 150 to relay data. However, it should be noted that encoder/decoder systems 50 and 150, which are placed in repeaters 258 and 262, use state of the art equalizers in order to provide additional compensation for signal degradation and group delays. The repeater encoder/decoder systems also utilize elastic buffers (positioned after the splitters and combiners) in order to provide additional compensation.

Although the present invention has been illustrated above with reference to particular exemplary embodiments, these embodiments are merely illustrative of the invention and should not be taken as limiting the scope of the invention. For instance, it will be understood by one of ordinary skill in the art that alternative embodiments of the present invention's Ethernet encoding/decoding systems can be constructed with different numbers of twisted pairs or different maximum bit rates. For example, another embodiment of the present invention is a 100 MBit two twisted pair full-duplex Ethernet network which uses 4B-1H multilevel code (i.e., a code which represents four binary bits by one wave which can have any one of sixteen values). Yet another exemplary embodiment of the present invention is a 200 MBit four twisted pair full-duplex (or two twisted pair half-duplex) Ethernet network which uses 4B-1H multilevel code.

I claim:

1. An encoder for encoding binary data bits supplied by a data source into multilevel pulse amplitude modulated symbols, wherein said symbols are transmitted over a transmission medium subject to a maximum baseband bandwidth frequency, said encoder comprising:

a bit stuffer for receiving said data bits at a first data bit rate from said data source, said bit stuffer adding descriptive bits to said data bits at a descriptive bit rate, wherein said first data bit rate at most equals a maximum data bit rate and said descriptive bit rate at most equals a maximum descriptive bit rate; and a modulator for receiving said data and descriptive bits from said bit stuffer and for converting said data and descriptive bits into multilevel pulse amplitude modulated symbols having a baud rate, wherein said baud rate at most equals a maximum baud rate when said first data bit rate equals the maximum data bit rate and said descriptive bit rate equals the maximum descriptive bit rate, wherein said maximum baud rate has a magnitude equal to a magnitude of said baseband bandwidth frequency such that surplus spectral energy within the baseband bandwidth is utilized for said descriptive bits.

2. The encoder of claim 1, wherein said descriptive bits are delimiter bits.

3. The encoder of claim 1, wherein said descriptive bits are parity bits for maintaining a predetermined bit error rate and a predetermined hamming distance while increasing the first data bit rate from a second lower data bit rate to the maximum data bit rate.

4. The encoder of claim 1, wherein said multilevel pulse amplitude modulated symbols have at least three levels and whose spectral characteristic shows an energy null at the baseband bandwidth frequency when transmitted.

5. The encoder of claim 1, wherein said encoder is an Ethernet network encoder.

6. The encoder of claim 1, wherein said modulator is a 2B-1Q modulator.

7. An Ethernet encoder for encoding input data bits supplied by a data source into multilevel pulse amplitude modulated symbols having at least three levels and for supplying said symbols to a channel A twisted pair cable and a channel B twisted pair cable, wherein said symbols are transmitted over said twisted pair cables subject to a maximum baseband bandwidth frequency, said encoder comprising:

a) a splitter for receiving said input data bits at a first data bit rate from said data source and for splitting said input data bits into channel A data bits and channel B data bits;

b) a channel A bit stuffer for receiving said channel A data bits from said splitter and for adding channel A descriptive bits to said channel A data bits at a channel A descriptive bit rate, wherein said channel A descriptive bit rate at most equals a maximum channel A descriptive bit rate;

c) a channel B bit stuffer for receiving said channel B data bits from said splitter and for adding channel B descriptive bits to said channel B data bits at a channel B descriptive bit rate, wherein said channel B descriptive bit rate at most equals a maximum channel B descriptive bit rate;

d) a channel A modulator for receiving said channel A data and descriptive bits from said channel A bit stuffer, converting said channel A data and descriptive bits into channel A multilevel pulse amplitude modulated symbols having a channel A baud rate, and supplying said channel A symbols to said channel A twisted pair cable; and e) a channel B modulator for receiving said channel B data and descriptive bits from said channel B bit stuffer, converting said channel B data and descriptive bits into channel B multilevel pulse amplitude modulated symbols having a channel B baud rate, and supplying said channel B symbols to said channel B twisted pair cable;

f) wherein said channel A and channel B baud rates at most equal a maximum baud rate when said first data bit rate equals the maximum data bit rate and said descriptive bit rates equal the maximum descriptive bit rates, said maximum baud rate having a magnitude equal to a magnitude of said baseband bandwidth frequency.

8. The Ethernet encoder of claim 7, wherein said descriptive bits are delimiter bits.

9. The Ethernet encoder of claim 7, wherein said descriptive bits are parity bits for maintaining a predetermined bit error rate and a predetermined hamming distance while increasing the first data bit rate from a second lower data bit rate to the maximum data bit rate.

10. The Ethernet encoder of claim 9, wherein said channel A parity bits are even parity bits and said channel B parity bits are odd parity bits.

11. The Ethernet encoder of claim 9, wherein said baseband bandwidth frequency is 30 MHz, said maximum data bit rate is 100 MBits/s, said second lower data bit rate is 10 MBits/s, said bit error rate is below $10^{-9}$, and said hamming distance is at least 4.

12. The Ethernet encoder of claim 7, wherein said baseband bandwidth frequency is 30 MHz and said maximum data bit rate is 100 MBits/s.

13. The Ethernet encoder of claim 7, wherein said pulse amplitude modulated multilevel symbols are 2B-1Q symbols.

14. The Ethernet encoder of claim 7 adapted to operate in a two twisted pair half-duplex Ethernet encoding and decoding apparatus.

15. The Ethernet encoder of claim 7 adapted to operate in a four twisted pair full-duplex Ethernet encoding and decoding apparatus.

16. A four twisted pair full-duplex Ethernet encoding and decoding system comprising:
- a) a first encoder for coupling to a first data node to receive a first set of input data bits, said first encoder encoding said first set of input data bits into a first set of multilevel pulse amplitude modulated symbols having at least three levels;
- b) a second encoder for coupling to a second data node to receive a second set of input data bits, said second encoder encoding said second set of input data bits into a second set of multilevel pulse amplitude modulated symbols having at least three levels;
- c) a channel A twisted pair cable and a channel B twisted pair cable receiving said first set of symbols from said first encoder at a channel A baud rate and a channel B baud rate;
- d) a channel C twisted pair cable and a channel D twisted pair cable receiving said second set of symbols from said second encoder at a channel C baud rate and a channel D baud rate, wherein when said symbols are supplied to said twisted pair cables said symbols are subject to a maximum baseband bandwidth frequency;
- e) a first decoder for coupling to said second data node to supply said first set of input data bits to said second data node, said first decoder receiving said first set of symbols from said channel A and B twisted pair cables and decoding said first set of symbols into said first set of input data bits; and
- f) a second decoder for coupling to said first data node to supply said second set of input data bits to said first data node, said second decoder receiving said second set of symbols from said channel C and D twisted pair cables and decoding said second set of symbols into said second set of input data bits;
- g) wherein said channel A, B, C, and D baud rates at most equal a maximum baud rate having a magnitude equal to a magnitude of said baseband bandwidth frequency.

17. The Ethernet encoding and decoding apparatus of claim 16, wherein said first encoder comprises:
- a) a splitter for receiving said first set of input data bits at a first data bit rate from said first data node and for splitting said first set of input data bits into channel A data bits and channel B data bits;
- b) a channel A bit stuffer for receiving said channel A data bits from said splitter and for adding channel A descriptive bits to said channel A data bits at a channel A descriptive bit rate, wherein said channel A descriptive bit rate at most equals a maximum channel A descriptive bit rate;
- c) a channel B bit stuffer for receiving said channel B data bits from said splitter and for adding channel B descriptive bits to said channel B data bits at a channel B descriptive bit rate, wherein said channel B descriptive bit rate at most equals a maximum channel B descriptive bit rate;
- d) a channel A modulator for receiving said channel A data and descriptive bits from said channel A bit stuffer, converting said channel A data and descriptive bits into channel A multilevel pulse amplitude modulated symbols having said channel A baud rate, and supplying said channel A symbols to said channel A twisted pair cable; and
- e) a channel B modulator for receiving said channel B data and descriptive bits from said channel B bit stuffer, converting said channel B data and descriptive bits into channel B multilevel pulse amplitude modulated symbols having said channel B baud rate, and supplying said channel B symbols to said channel B twisted pair cable;
- f) wherein said channel A and channel B baud rates at most equal said maximum baud rate when said first data bit rate equals the maximum data bit rate and said descriptive bit rates equal the maximum descriptive bit rates.

18. The Ethernet encoder of claim 17, wherein said descriptive bits are delimiter bits.

19. The Ethernet encoder of claim 17, wherein said descriptive bits are parity bits for maintaining a predetermined bit error rate and a predetermined hamming distance while increasing the first data bit rate from a second lower data bit rate to the maximum data bit rate.

20. The Ethernet encoder of claim 19, wherein said channel A parity bits are even parity bits and said channel B parity bits are odd parity bits.

21. The Ethernet encoder of claim 19, wherein said baseband bandwidth frequency is 30 MHz, said maximum data bit rate is 100 MBits/s, said second lower data bit rate is 10 MBits/s, said bit error rate is below $10^{-9}$, and said hamming distance is at least 4.

22. The Ethernet encoder of claim 17, wherein said baseband bandwidth frequency is 30 MHz and said maximum data bit rate is 100 MBits/s.

23. The Ethernet encoder of claim 17, wherein said pulse amplitude modulated multilevel symbols are 2B-1Q symbols.

24. An encoding method for encoding binary data bits supplied by a data source into multilevel pulse amplitude modulated symbols, wherein said symbols are transmitted over a transmission medium subject to a maximum baseband bandwidth frequency, said encoding method comprising the steps of:
- receiving said data bits at a first data bit rate from said data source;
- adding descriptive bits to said data bits at a descriptive bit rate, wherein said first data bit rate at most equals a maximum data bit rate and said descriptive bit rate at most equals a maximum descriptive bit rate; and
- converting said data and descriptive bits into multilevel pulse amplitude modulated symbols having a baud rate, wherein said baud rate at most equals a maximum baud rate when said first data bit rate equals the maximum data bit rate and said descriptive bit rate equals the maximum descriptive bit rate, wherein said maximum baud rate has a magnitude equal to a magnitude of said baseband bandwidth frequency such that surplus spectral energy within baseband bandwidth is utilized for said descriptive bits.

25. The encoding method of claim 24, wherein said descriptive bits are parity bits for maintaining a predetermined bit error rate and a predetermined hamming distance while increasing the first data bit rate from a second lower data bit rate to the maximum data bit rate.

26. The encoding method of claim 24, wherein said pulse amplitude modulated multilevel symbols are 2B-1Q symbols.

27. An Ethernet encoding method for encoding input data bits supplied by a data source into multilevel pulse amplitude modulated symbols having at least three levels and for supplying said symbols to a channel A twisted pair cable and a channel B twisted pair cable, wherein said symbols are transmitted over said twisted pair cables subject to a maximum baseband bandwidth frequency, said encoding method comprising the steps of:

a) receiving said input data bits at a first data bit rate from said data source;

b) splitting said input data bits into channel A data bits and channel B data bits;

c) adding channel A descriptive bits to said channel A data bits at a channel A descriptive bit rate, wherein said channel A descriptive bit rate at most equals a maximum channel A descriptive bit rate;

d) adding channel B descriptive bits to said channel B data bits at a channel B descriptive bit rate, wherein said channel B descriptive bit rate at most equals a maximum channel B descriptive bit rate;

e) converting said channel A data and descriptive bits into channel A multilevel pulse amplitude modulated symbols having a channel A baud rate, and supplying said channel A symbols to said channel A twisted pair cable; and f) converting said channel B data and descriptive bits into channel B multilevel pulse amplitude modulated symbols having a channel B baud rate, and supplying said channel B symbols to said channel B twisted pair cable;

g) wherein said channel A and channel B baud rates at most equal a maximum baud rate when said first data bit rate equals the maximum data bit rate and said descriptive bit rates equal the maximum descriptive bit rates, said maximum baud rate having a magnitude equal to a magnitude of said baseband bandwidth frequency.

28. The Ethernet encoding method of claim 27, wherein said descriptive bits are parity bits for maintaining a predetermined bit error rate and a predetermined hamming distance while increasing the first data bit rate from a second lower data bit rate to the maximum data bit rate.

29. The Ethernet encoding method of claim 27, wherein said channel A parity bits are even parity bits and said channel B parity bits are odd parity bits.

30. The Ethernet encoding method of claim 27, wherein said pulse amplitude modulated multilevel symbols are 2B-1Q symbols.

31. The Ethernet encoding method of claim 27 adapted to operate in a two twisted pair half-duplex Ethernet encoding and decoding method.

32. The Ethernet encoding method of claim 27 adapted to operate in a four twisted pair full-duplex Ethernet encoding and decoding method.

* * * * *